United States Patent [19]
Son

[11] Patent Number: 5,696,012
[45] Date of Patent: Dec. 9, 1997

[54] FABRICATION METHOD OF SEMICONDUCTOR MEMORY DEVICE CONTAINING CMOS TRANSISTORS

[75] Inventor: Jeong-Hwan Son, Daejon, Rep. of Korea

[73] Assignee: LG Semicon Co., Ltd., Choongcheongbuk-do, Rep. of Korea

[21] Appl. No.: 772,851

[22] Filed: Dec. 24, 1996

[30] Foreign Application Priority Data

Dec. 29, 1995 [KR] Rep. of Korea ............... 67325/1995

[51] Int. Cl.$^6$ ................. H01L 21/265; H01L 21/8238
[52] U.S. Cl. ............................... 437/44; 437/57
[58] Field of Search ........................ 437/57, 34, 44, 437/40–41

[56] References Cited

U.S. PATENT DOCUMENTS

| | | | |
|---|---|---|---|
| 4,757,026 | 7/1988 | Woo et al. | 437/29 |
| 4,818,714 | 4/1989 | Haskell | 437/44 |
| 4,937,645 | 6/1990 | Ootsuka et al. | |
| 4,949,136 | 8/1990 | Jain . | |
| 5,460,993 | 10/1995 | Hsu et al. | 437/44 |
| 5,518,945 | 5/1996 | Bracchitta et al. | 437/44 |

OTHER PUBLICATIONS

Kang et al, VLSI Symposium, "New Transistor Structure Optimization for 0.25μm CMOS Technology", pp. 85–86 (1991), month unknown.

*Primary Examiner*—John Niebling
*Assistant Examiner*—Richard A. Booth

[57] ABSTRACT

A fabrication method for a semiconductor memory device which remarkably improves a short-channel characteristic, and increases a driving electric current of the device by differently forming the thickness of side wall spacers formed at the sides of polysilicon gates in nMOS and pMOS regions, includes forming a gate insulating film on a semiconductor substrate having first and second regions, forming first and second gate electrodes in the first and second regions, respectively, on the substrate, forming a first conductive low concentration impurity area at the sides of the first gate electrode, forming a second conductive low concentration impurity area at the sides of the second gate electrode, forming a first insulating film on the substrate and a second insulating film on the first insulating film, stripping the second insulating film in the first region, forming first sidewall spacers at the sides of the first gate electrode, forming a first conductive high concentration impurity area in the substrate at the sides of the first gate electrode, forming second sidewall spacers composed of the first and second insulating films at the sides of the second gate electrode in the second region, and forming a second conductive high concentration impurity area in the substrate at the sides of the second gate electrode.

6 Claims, 3 Drawing Sheets

FABRICATION METHOD OF SEMICONDUCTOR MEMORY DEVICE CONTAINING CMOS TRANSISTORS

BACKGROUND OF THE INVENTION

1. Field of the Invention

The present invention relates to a fabrication method of a semiconductor memory device, and in particular, to an improved fabrication method of a semiconductor memory device which is capable of remarkably improving a short-channel characteristic, and of increasing a driving electric current of the device by differently forming the thickness of side wall spacers formed at the sides of a polysilicon gate in nMOS and pMOS regions.

2. Description of the Prior Art

Conventionally, in a pMOS lightly doped drain (hereinafter, called LDD) device, since the diffusion of p+ is greater than that of n+, a thin p- LDD region disappears owing to a lateral diffusion of p+, and a deep junction is formed, resulting in a deterioration of a short channel characteristic of a semiconductor memory device.

A fabrication method for a semiconductor memory device to improve the short channel characteristic of the semiconductor memory device and increase a driving electric current, has been published in a recent article (VLSI symposium 1991,p.85–86). As shown in FIG. 1, after a gate oxide film 2 is formed on a predetermined portion of a semiconductor substrate 1 and polysilicon is deposited on the gate oxide film 2 to form a gate pattern in the nMOS and pMOS regions by a photolithography process. Then, n-and p-LDD regions 4a,4b are formed by performing an ion implantation using the gates 3 in the nMOS and pMOS regions as masks. Then, an insulating film is deposited on the semiconductor substrate 1 including the nMOS and pMOS regions and etched to form sidewall spacers 5a at the sides of the gates 3 in the nMOS and pMOS regions, respectively. Next, an n+ region is formed in the semiconductor substrate 1 by performing an ion implantation in the nMOS region alone. Then, an insulating film is deposited on the semiconductor substrate 1, and then sidewall spacers 5b are formed at the sides of the gate 3 in the pMOS region. That is, at the sides of the gate 3 in the pMOS region, thicker sidewall spacers are formed in comparison with the sidewall spacers at the sides of the gate 3 in the nMOS region. Then, the p+ regions are formed in the semiconductor substrate 1 by performing an ion implantation in the pMOS region alone.

As shown in FIG. 2, however, when the conventional fabrication method for a semiconductor memory device is adopted in fabricating a DRAM device having a cell-transistor, thick sidewall spacers prevent the performing of an ion implantation for forming an n+ region and the formation of a self-aligned contact hole, for which reason it is difficult to adopt this method to fabricating a highly integrated DRAM device in the future.

SUMMARY OF THE INVENTION

Accordingly, it is an object of the present invention to provide an improved fabrication method for a semiconductor memory device which is capable of forming a cell-transistor in fabricating a DRAM device by forming a sidewall spacer in a pMOS region thicker than that in an nMOS region.

To achieve the above object, there is provided a novel and useful fabrication method which includes forming a gate insulating film on a semiconductor substrate having first and second regions, forming first and second gate electrodes in the first and second regions on the substrate, forming a first conductive low concentration impurity area in the substrate of the first region at the sides of the first gate electrode, forming a second conductive low concentration impurity area in the second region on the substrate at the sides of the second gate electrode, forming a first insulating film on the substrate having the first and second gate electrodes thereon and a second insulating film on the first insulating films, stripping the second insulating film in the first region, forming a first sidewall spacer at the sides of the first gate electrode by performing an anisotropic etching on the first insulating film in the first region, forming a first conductive high concentration impurity area in the substrate of the first region at the sides of the first gate electrode having the first sidewall spacer, forming a second sidewall spacer composed of the first and second insulating films at the sides of the second gate electrode by performing an anisotropic etching on the first and second insulating films in the second region, and forming a second conductive high concentration impurity area in the substrate of the second region at the sides of the second gate electrode having the second sidewall spacer.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Referring to the accompanying drawings, the fabrication method for a semiconductor memory device according to the invention will now be described in detail.

Figure 1:
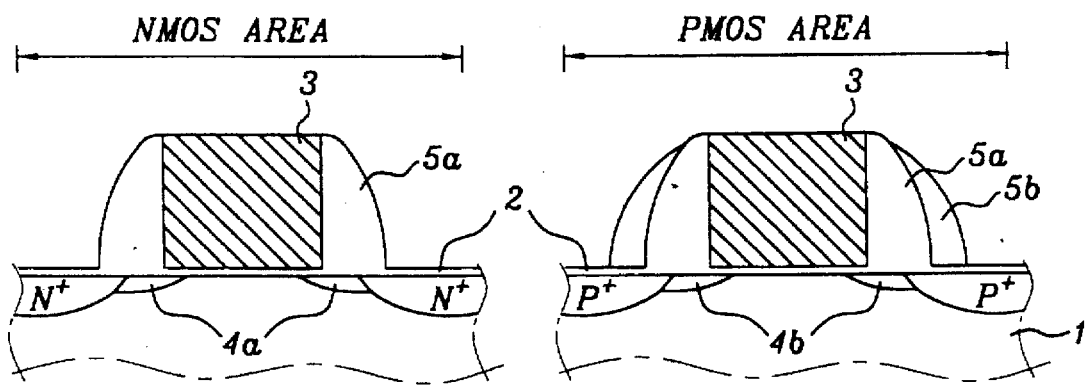
FIG. 1 is a view showing a fabrication method for a semiconductor memory device according to the conventional art.
Figure 2:
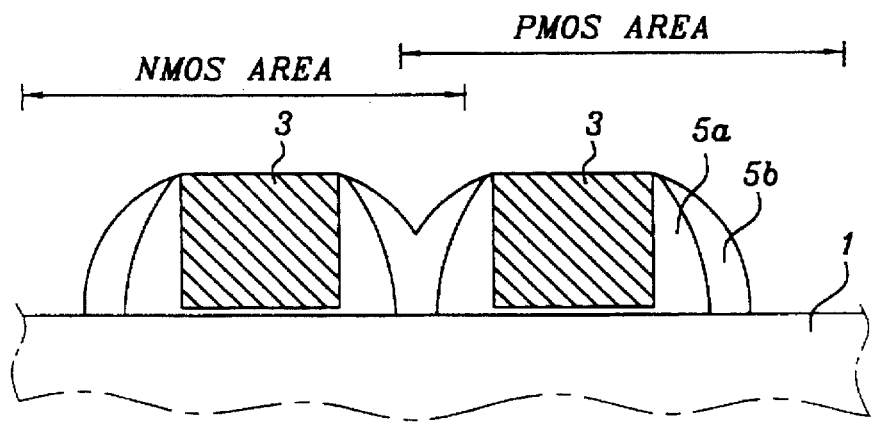
FIG. 2 is a view showing the adoption of the conventional fabrication method for a semiconductor memory device to the fabrication of a DRAM device.
Figure 3A:
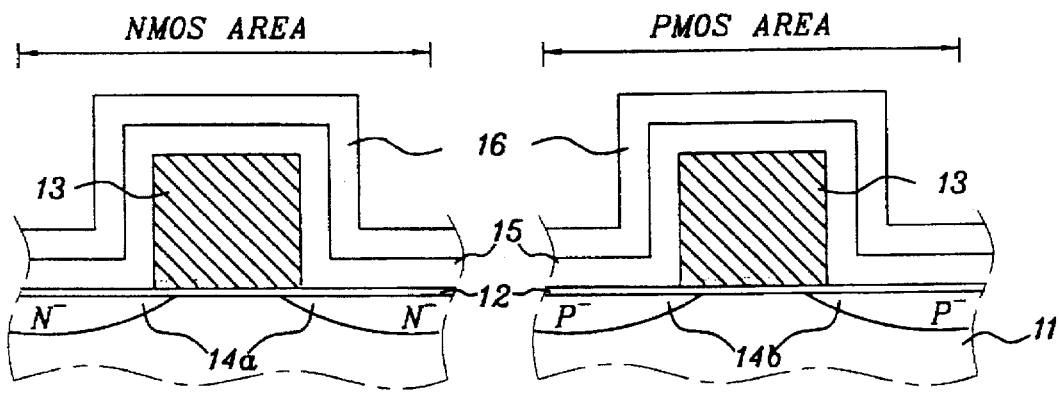
FIGS. 3A through 3C are views showing a fabrication method for a semiconductor memory device according to the present invention.
Figure 3B:
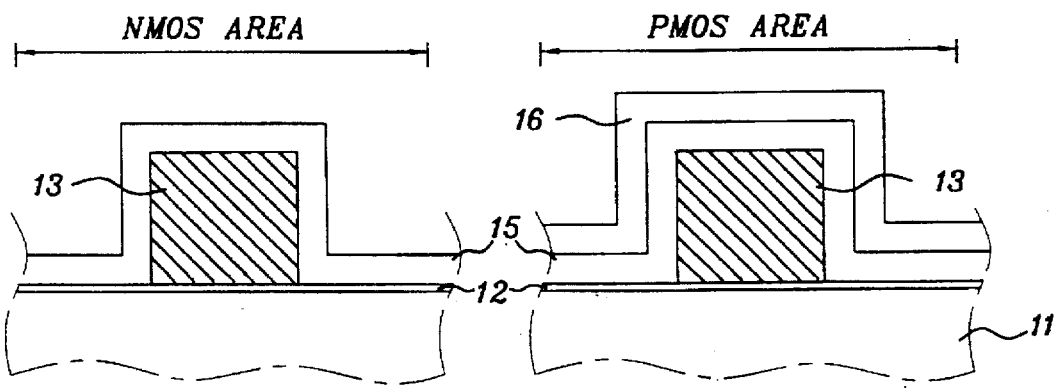
Figure 3C:
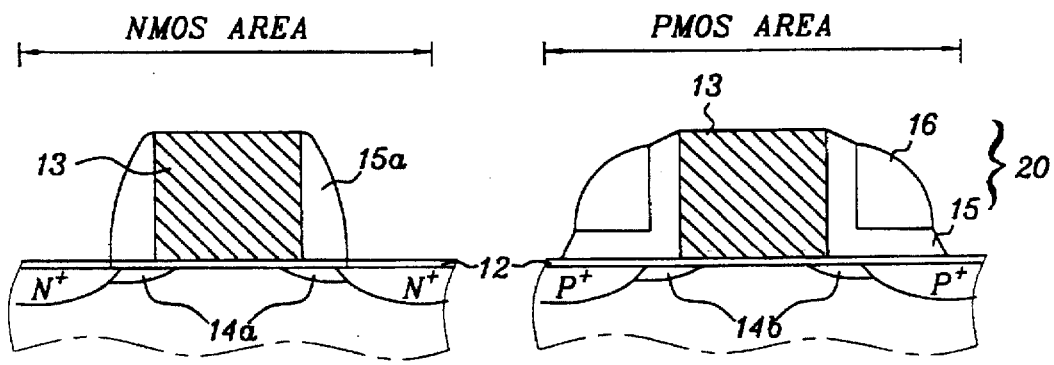

FIGS. 3A through 3C are views showing the fabrication method for a semiconductor memory device according to the present invention.

First, as shown in FIG. 3A, a gate oxide film 12 is formed on the semiconductor substrate 11, and the pattern for a polysilicon gate 13 is formed in each of nMOS and pMOS regions which serve as first and second regions, respectively by a photolithography process. Then, after defining the first region, a first low density impurity drain region 14a (that is, n- LDD region) is formed by an ion implantation, and after defining the second region, a second conductive low density impurity drain region 14b (that is, p- LDD region) is formed by an ion implantation. Next, a CVD oxide film which serves as a first insulating film 15 is deposited on the semiconductor substrate 11 including the first and second regions, and then a CVD nitride film which serves as a second insulating film 16 is deposited. Here, by sequentially depositing the CVD oxide film and the CVD nitride film, the second insulating film may be formed.

As shown in FIG. 3B, a photoresist film (not illustrated) is coated on the second insulating film 16, and after defining the first region and carrying out a photolithography process, the first region is exposed. The second insulating film 16 in the first region is stripped by carrying out an anisotropic etching, using the photoresist film (not illustrated) as a mask.

As shown in FIG. 3C, the anisotropic etching is performed on the first insulating film in the first region, resulting in the formation of sidewall spacers 15a at the sides of the polysilicon gate 13 in the first region, and then by an ion implantation, a first conductive high concentration impurity area (n+) is formed in the semiconductor substrate 11. Then, a photoresist film (not illustrated) is coated again on the first and second regions, and after defining the second region and carrying out the photolithography process, the second region is exposed. Using the photoresist film (not illustrated) as a mask, an anisotropic etching is performed, resulting in the formation of sidewall spacers 16 composed of the second insulating film 16 on the first insulating film 15 at the sides of the polysilicon gate 13, and the first insulating film 15 is etched using as a mask the photoresist film (not illustrated) and the second insulating film 16, and consequently, sidewall spacers composed of the first insulating film 15 are formed between the sides of the polysilicon gate 13 and the sidewall spacers composed of the second insulating film 16, resulting in the formation of a insulating film sidewall spacers 20 having a dual construction. Then, by ion implantation, a second conductive high concentration impurity area (p+) is formed in the semiconductor substrate 11. Here, by sequentially depositing an oxide film, a nitride film and then an oxide film again, the sidewall spacers 20 may be formed.

As described above, according to the fabrication method for a semiconductor memory device, in order to selectively form a thick spacer in the pMOS region, a CVD nitride film or a CVD oxide film/a CVD nitride film may be deposited, and a photolithography process may be further carried out thereon.

Figure 4:
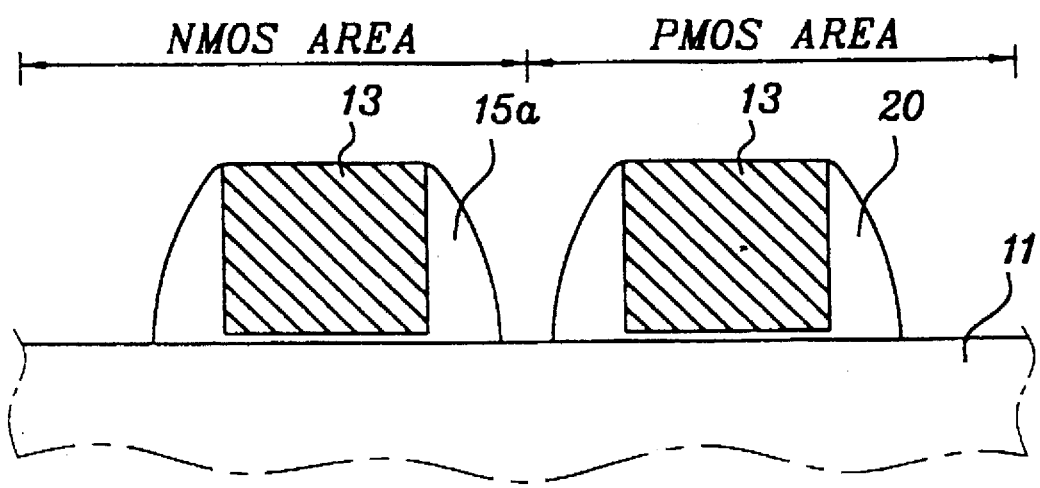
FIG. 4 is a view showing the adoption of the present fabrication method for a semiconductor memory device to the fabrication of a DRAM device.

FIG. 4. shows the structure of a cell transistor when adopting the fabrication method to the fabrication of a DRAM device. In the adjoining cell transistor region, since each sidewall spacer 15a,20 is formed to have a regular interval therebetween, an ion implantation and a self-aligned contact process can be performed. Therefore, the fabrication method can be adopted to the 256M DRAM fabrication process for future memory device.

According to the present invention, the problems that occur when the conventional fabrication method is adopted in the fabrication of a DRAM can be solved by further employing deposition of a nitride film ($Si_3N_4$).

According to the semiconductor memory device fabrication method of the present invention, in order to improve the characteristics of a pMOS device, the sidewall spacer is required to be about 500~1,000 Å thicker than that of an nMOS device.

According to the fabrication method for a semiconductor memory device of the present invention, by using an oxide film/a nitride film which have an excellent etching selectivity against a wet-etching, a double sidewall spacer is formed in a pMOS region alone, and after stripping the nitride film in the nMOS region by dry-etching, a thick sidewall spacer is selectively formed in the pMOS region alone. Thereby, if this method is adopted in the conventional fabrication process for a DRAM device, ion implantations can be effectively obtained without cell-transistor overlapping.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A fabrication method for a semiconductor memory device, comprising:

forming a gate insulating film on a semiconductor substrate having first and second regions;

forming first and second gate electrodes in the first and second regions, respectively, on the substrate;

forming a first conductive low concentration impurity area in the substrate of the first region at the sides of the first gate electrode;

forming a second conductive low concentration impurity region in the second region on the substrate at the sides of the second gate electrode;

forming a first insulating film on the substrate having the first and second gate electrodes thereon and a second insulating film on the first insulating film;

stripping the second insulating film in the first region;

forming first sidewall spacers at the sides of the first gate electrode by performing an anisotropic etching on the first insulating film in the first region;

forming a first conductive high concentration impurity area in the first region of the subtrate at the sides of the first gate electrode having the first sidewall spacers;

forming second sidewall spacers composed of the first and second insulating films at the sides of the second gate electrode by performing an anisotropic etching on the first and second insulating films in the second region; and forming a second conductive high concentration impurity region in the substrate of the second region at the sides of the second gate electrode having the second sidewall spacers.

2. The fabrication method of claim 1, wherein the first insulating film is composed of an oxide film, and the second insulating film is composed of a nitride film.

3. The fabrication method of claim 1, wherein the first insulating film is composed of a nitride film, and the second insulating film is composed of an oxide film.

4. The fabrication method of claim 1, wherein the first conductive impurity is an n-type impurity, and the second conductive impurity is a p-type impurity.

5. The fabrication method of claim 1, wherein the steps for forming the first sidewall spacers comprise:

forming the first insulating film;

forming a photoresist film on the second insulating film after forming the second insulating film on the first insulating film;

stripping the photoresist film in the first region; and performing an anisotropic etching on the second insulating film, using the photoresist film as a mask.

6. The fabrication method of claim 1, wherein the steps for forming the second side wall spacers comprise:

forming a photoresist film on the second insulating film in the first and second regions;

forming sidewall spacers composed of the second insulating film on the first insulating film at the sides of the second gate electrode by performing an anisotropic etching on the second insulating film, using the photoresist film as a mask; and forming sidewall spacers composed of the first insulating film between the sides of the second gate electrode and the sidewall spacers composed of the second insulating film by etching the first insulating film, using as a mask the photoresist film and the second insulating film.

* * * * *

UNITED STATES PATENT AND TRADEMARK OFFICE
Certificate

Patent No. 5,696,012

Patented: December 9, 1997

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Jeong-Hwan Son and Hyun-Sang Hwang.

Signed and Sealed this Sixth Day of April, 1999.

JOHN F. NIEBLING
*Supervisory Primary Examiner*
Art Unit 2812